United States Patent
Wood et al.

(10) Patent No.: US 7,282,935 B2
(45) Date of Patent: Oct. 16, 2007

(54) REGENERATOR PROBE

(75) Inventors: Glenn Wood, Colorado Springs, CO (US); Donald M. Logelin, Colorado Springs, CO (US); Brock J. LaMeres, Colorado Springs, CO (US); Brent A. Holcombe, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/338,274

(22) Filed: Jan. 24, 2006

(65) Prior Publication Data

US 2007/0170936 A1     Jul. 26, 2007

(51) Int. Cl.
*G01R 31/02* (2006.01)
*G01R 31/28* (2006.01)

(52) U.S. Cl. ............... 324/754; 324/72.5; 324/522

(58) Field of Classification Search ........ 324/754–765, 324/72.5
See application file for complete search history.

(56) References Cited

U.S. PATENT DOCUMENTS

| | | | | |
|---|---|---|---|---|
| 4,506,210 A | * | 3/1985 | Chase ........................ | 324/66 |
| 5,293,113 A | * | 3/1994 | Beha et al. ................ | 324/72.5 |
| 5,460,028 A | * | 10/1995 | Werner et al. ............... | 73/1.88 |
| 6,160,408 A | * | 12/2000 | Fenton ....................... | 324/754 |
| 6,909,272 B2 | * | 6/2005 | Bengtsson .................. | 324/126 |
| 7,083,423 B1 | * | 8/2006 | Guerra et al. ................ | 439/62 |

* cited by examiner

*Primary Examiner*—Ha Tran Nguyen
*Assistant Examiner*—Emily Y Chan
(74) *Attorney, Agent, or Firm*—June L. Bouscaren

(57) ABSTRACT

A probe apparatus has first and second access ports and a measurement port. The first and second access ports are adapted to be interposed in a test circuit. A voltage amplifier and a voltage splitter are adapted to present the second access port and the measurement port each with a voltage representative of a voltage received by the first access port.

26 Claims, 4 Drawing Sheets

REGENERATOR PROBE

BACKGROUND

An important aspect of digital circuit testing is proper probing of a target system. As an example, logic analysis seeks to make measurements of the target system at speed without affecting target system circuit operation. Ideally, probe apparatus samples circuit voltages exactly as they would as they appear during unprobed operation of the target system. As frequency of operation of the target systems increases, however, it becomes more difficult to probe the target system without adding parasitic impedances to the target system circuits that affect its operation.

A known style of probe apparatus that is suitable for circuit test is a "snoop probe". With specific reference to FIG. 1 of the drawings, an example of the snoop probe is shown whereby one or more communication lines 101 of the target system circuit is interrupted and the snoop probe in interposed between two ends of the interrupted line. The snoop probe provides a through connection for the interrupted communication line 101 to permit operation, but also has a parallel sampling circuit for probing signal activity on the line. The snoop probe includes a through circuit portion with a tip resistor 102 connected in parallel to the through circuit. The tip resistor 102 provides isolation between the through circuit portion and a measurement device 103. A probe cable 104 connected to the tip resistor 102 brings a sampled signal to the test equipment 103. The test equipment 103 is terminated in a termination impedance. Typically, an impedance of the tip resistor is 5-10 times that of the termination impedance. Advantageously, the snoop probe provides passive probing and isolation from the test equipment. A disadvantage of the known snoop probe is that the test signal as seen by the measurement device is significantly attenuated by a voltage division ratio of the termination impedance relative to the impedance of the tip resistor 102 added to the termination impedance. Because of the voltage division ratio, the test equipment also sees an attenuated slew rate of the signals being measured. Therefore, the effective conversion of noise voltage is similarly slowed, which contributes to jitter in the measurement. The larger the isolation resistor, the better the isolation of the target system from the measurement device 103, but the more the slew rate is attenuated and the larger the apparent measurement jitter. As one of ordinary skill in the art appreciates, the converse is also true. The jitter measurement may be improved with a smaller tip resistor impedance, but at the expense of isolation of the target system circuit 108 from the measurement device 103. Another disadvantage of the snoop probe in that parasitic capacitance that is inherent in the tip resistor 102 causes the isolation to decrease as test signal frequencies increase.

There is a need for an improved probe to provide sampling of signals in a target system without affecting its operation.

BRIEF DESCRIPTION OF THE DRAWINGS

An understanding of the present teachings can be gained from the following detailed description, taken in conjunction with the accompanying drawings of which like reference numerals in different drawings refer to same or similar elements.

DETAILED DESCRIPTION

In the following detailed description, for purposes of explanation and not limitation, example embodiments disclosing specific details are set forth in order to provide a thorough understanding of embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatus and methods may be omitted so as to not obscure the description of the example embodiments. Such methods and apparatus are clearly within the scope of the present teachings.

Figure 1:
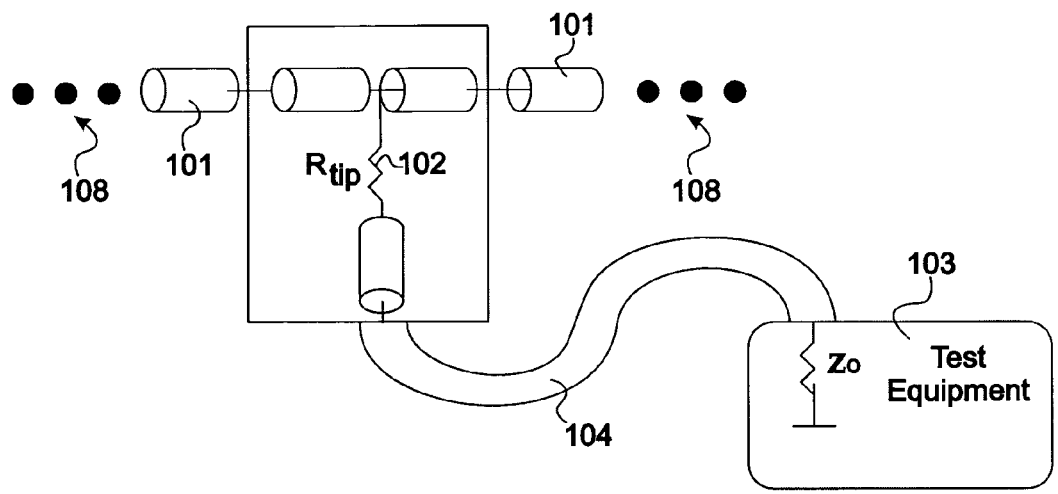
FIG. 1 illustrates a circuit configuration of a known probe.
Figure 2:
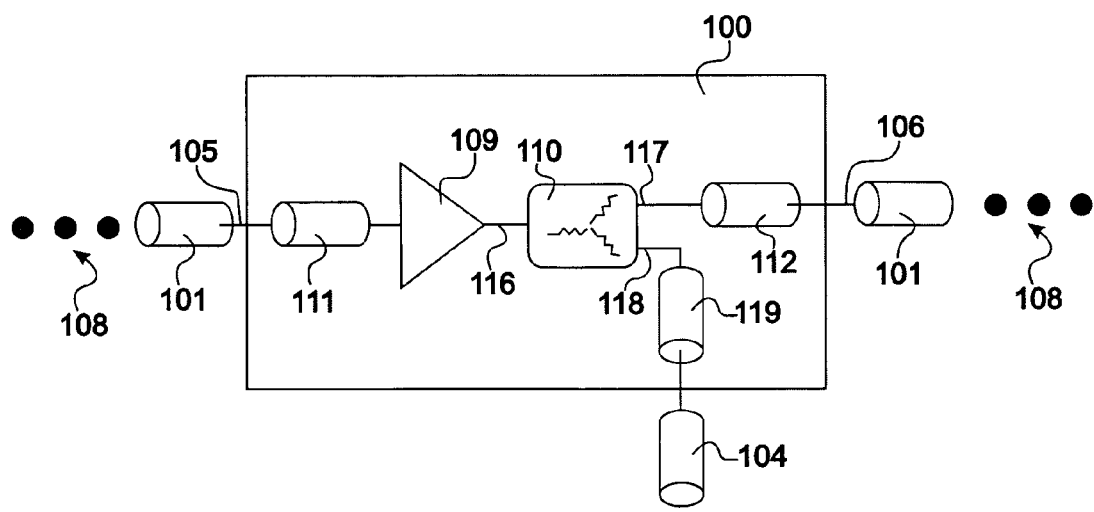
FIGS. 2-4 illustrate embodiments of single line probe circuits according to the present teachings.

With specific reference to FIG. 2 of the drawings, there is shown an embodiment of a regenerator probe apparatus 100 according to the present teachings in which the probe apparatus 100 is interposed in a communication line 101 of a target system 108. The communication line 101 is interrupted and each end of the interrupted communication line 101 is connected to a respective first access port 105 and second access port 106 of the probe apparatus 100. In the probe apparatus embodiment illustrated in FIG. 2, the first access port 105 electrically connects to a first probe trace 111 and the first probe trace 111 is connected to a voltage amplifier 109. The voltage amplifier 109 is terminated in a characteristic impedance that matches an impedance of the target system circuit 108 so that the target system circuit 108 substantially operates as if the probe apparatus were not interposed into it. In a specific embodiment, the voltage amplifier 109 amplifies the voltage signal present at the first access port 105 by a factor of two and has a linear amplifier characteristic of operation and frequency response over the voltage range and frequency of the target system circuit 108. Accordingly, a voltage amplifier output 116 accurately represents the voltage signal activity at the first access port 105. The voltage amplifier output 116 is connected to a voltage splitter 110. In the specific embodiment shown in FIG. 2, the voltage splitter 110 is a 6 dB splitter so that half of the amplified voltage is presented to a first output of the voltage splitter 117 and half of the amplified voltage is presented to a second output 118 of the voltage splitter 110. A second probe trace 112 connects the first output of the voltage splitter 117 to the second access port 106. In a specific embodiment, the voltage at the first access port 105 is substantially equal to the voltage at the second access port 106. Accordingly, the operation of the target system is at speed with the exception of some additional incremental latency as a result of the increased transmission line and under conditions equivalent to those without the probe apparatus 100 interposed into a communication line. In a specific embodiment, multiple communication lines in the target system are probed and each line has a respective associated probe apparatus 100 for measurement of parallel lines in the target system. The second output of the voltage splitter 118 is connected to a measurement trace 119. The measurement trace 119 is connected to the probe cable 104 for presentation to the measurement device 103. In the specific embodiment illustrated, each communication line 101 is unidirectional. This embodiment may be adapted for use in a target system with a full duplex bus by having separate probe circuits including the amplifier/amplifiers and splitter for each direction. Accordingly, a probe apparatus according to the present teachings for a full duplex target system has two probe circuits and measurement port connections for each communication line 101.

Figure 3:
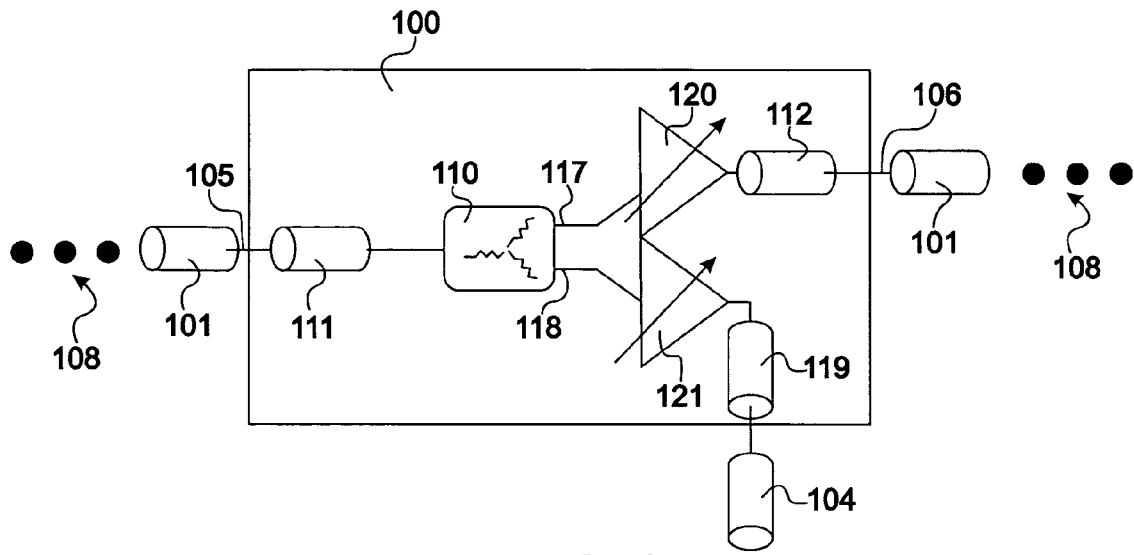

With specific reference to FIG. 3 of the drawings, there is shown another embodiment according to the present teachings in which the first access port 105 and first probe trace 111 are connected to the voltage splitter 110. The voltage splitter 110 is a 6 dB splitter and presents half of the input voltage to the first output of the voltage splitter 117 and half of the input voltage to the second output of the voltage splitter 118. The first output of the voltage splitter 117 is connected to a first voltage amplifier 120 and the second output of the voltage splitter 118 is connected to a second voltage amplifier 121. In an embodiment not specifically illustrated, the first and second voltage amplifiers are fixed amplifiers. In the embodiment illustrated in FIG. 3 of the drawings, each of the first and second voltage amplifiers is independently adjustable. The first voltage amplifier 120 is connected to the $2^{nd}$ probe trace 112 and the second access port 106. The second voltage amplifier 121 is connected to the measurement trace 119 and probe cable 104 for presentation to the measurement device 103. Accordingly, a user may choose to present substantially the same voltage at the output of the second voltage 121 amplifier as is found at the first access port 105 and may choose to attenuate or amplify the voltage signal presented to the first access port 105 and present it to the second access port 106. This feature may be used for parametric margin and limp-along testing of the target system while also permitting full measurement of the voltage signal at the first access port. As one of ordinary skill in the art readily appreciates, none, one or both of the first and second voltage amplifiers may provide variable amplification depending upon a specific testing requirement.

Figure 4:
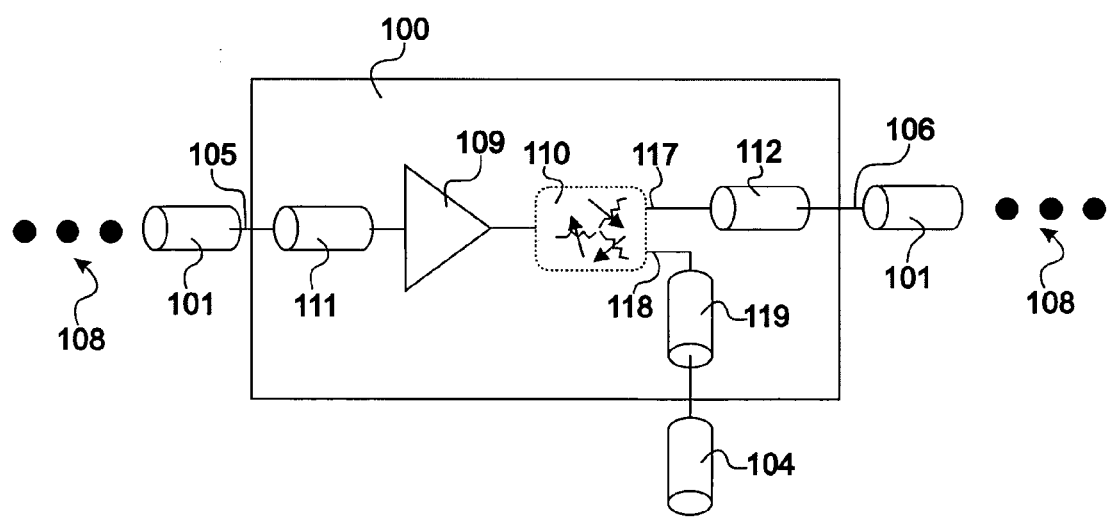

With specific reference to FIG. 4 of the drawings, there is shown another embodiment according to the present teachings that provides the feature present in the embodiment of FIG. 3 and employing only one voltage amplifier per tested communication line 101. Specifically, the first access port 105 and first probe trace 111 is connected to the voltage amplifier 109. The output of the voltage amplifier 116 is connected to the input of the voltage splitter 110. In the embodiment of FIG. 4, however, the voltage splitter 110 is variable. Accordingly, the voltage splitter 110 may be adjusted to present differing voltages at the first and second outputs 117, 118.

Figure 5:
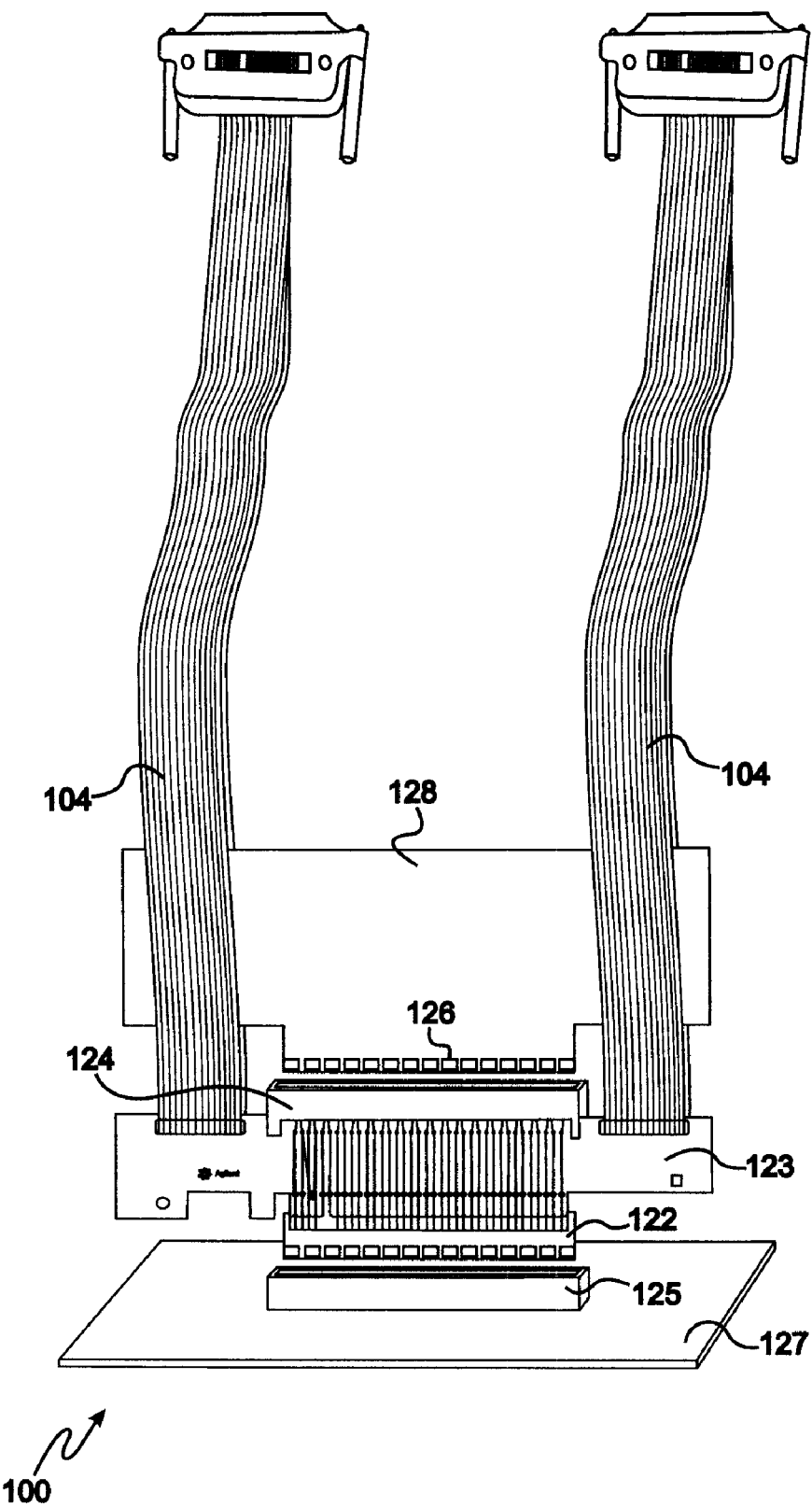
FIG. 5 illustrates an example form factor of a multiple line probe according to the present teachings.

With specific reference to FIG. 5 of the drawings, there is shown an embodiment of a form factor suitable for an embodiment of the probe apparatus according to the present teachings. In the illustrated embodiment, multiple target system communication lines 101 are interrupted at a target PCI-EXPRESS connector 125. A maximum number of communication lines 101 that may be probed is defined by the size of the target PCI-EXPRESS connector 125. Other connectors are suitable and may be adapted for the present teachings by one of ordinary skill in the art with benefit of the present teachings. The target PCI-EXPRESS connector 125 accepts an edge 122 of a probe printed circuit board 123 (PCB) to connect the probe apparatus 100 to each of the communication lines 101. In a specific embodiment, the probe PCB 123 has a configuration that includes first and second major planar surfaces. Edge 122 of the PCB 123 has the first access port 105 on the first planar surface of the probe PCB 123 and the second access port 106 is disposed opposite the first access port 105 on the second planar surface of the probe PCB 123. The probe PCB 123 carries electronics of a probe apparatus according to the present teachings for each communication line 101, such as the amplifier 109 and the splitter 110. Specifically, the probe PCB 123 holds multiple amplifiers and splitter depending upon the specific embodiment of the probe apparatus and the number of communication lines 101 being probed. Layout of the probe PCB 123 has respective communication line electronics organized together along a rectangular area of the PCB 123. The probe PCB 123 also carries a probe PCI-EXPRESS connector 124 having the same width and configuration as the target PCI-EXPRESS connector 124. Under normal operation, the probe 100 is not connected to the target system 127 and an edge 126 of companion PCB 128 is disposed in the target PCI-EXPRESS connector 124. Under probed operation, the probe 100 is connected to the target system 127 through the target PCI-EXPRESS connector 125 via the probe PCB card edge 122 and the companion PCB 128 is connected to the probe PCI-EXPRESS connector 124 to complete the target system circuit 127, 128. Beneficially, the probe PCB 123 may be inserted into the target system circuit 127, 128 to monitor, but not change operation of the target system 127. The probe PCB 123 interconnects respective measurement traces 119 to the probe cable 104 for connection to the test equipment 103.

Figure 6:
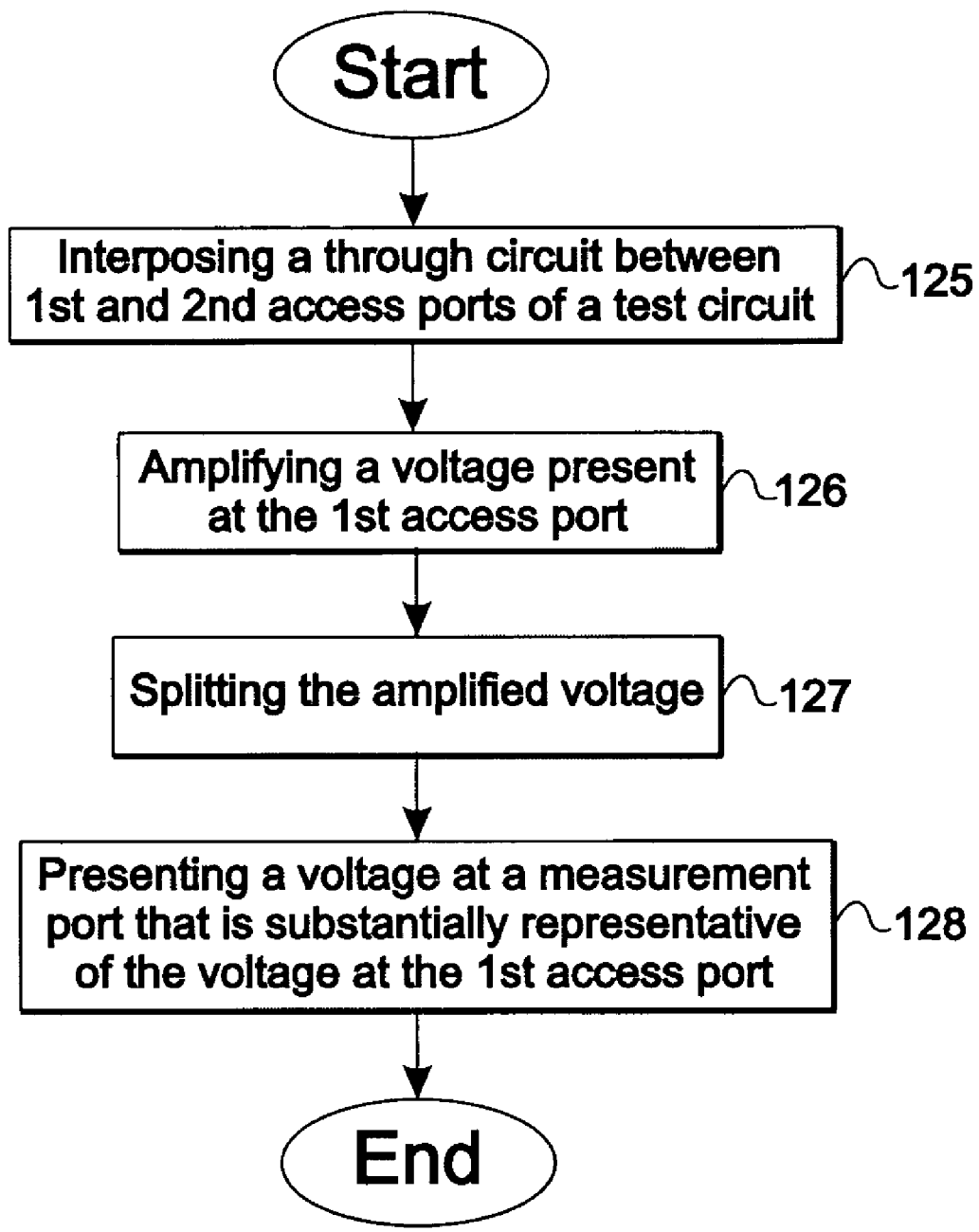
FIG. 6 is a flow chart of an embodiment of a method according to the present teachings.

With specific reference to FIG. 6 of the drawings, there is shown a flow chart of an embodiment according to the present teachings in which a through circuit is interposed 125 between first and second access ports 105, 106 of a test circuit. A voltage present at the first access port 105 is amplified 126 and split 127 and a voltage substantially similar to the voltage at the first access port 105 is presented 128 at an output 118 of the voltage splitter 110.

Embodiments of the teachings are described herein by way of example with reference to the accompanying drawings describing a probe apparatus and method of probing. As an example, in a multiple communication line embodiment according to the present teachings as shown in FIG. 3 or 4, respective amplifiers 120, 121 or variable splitters 110 for each separate communication line 101 may be independently adjusted for purposes of parametric testing of each line in addition to functional testing. Specifically, the amplifier 120 or variable splitter 110 is adjusted so that the test equipment 103 receives a voltage signal substantially similar to that found in the target system, but amplifies or attenuates the signal passed on to the rest of the target system through the communication line 101. Methods of carrying the amplification or attenuation may be manual or programmatic and depend upon design choice. Other variations, adaptations, and embodiments of the present teachings will occur to those of ordinary skill in the art given benefit of the present teachings.

The invention claimed is:

1. A probe apparatus comprising first and second access ports and a measurement port, the first and second circuit access ports adapted to be interposed in a test circuit, a voltage amplifier in series combination with a voltage splitter adapted to present the second access port and the measurement port each with a voltage substantially representative of a voltage received by the first access port.

2. A probe apparatus as recited in claim 1 comprising two or more of the first and second circuit access ports, and a respective plurality of the measurement ports, the amplifiers and the voltage splitters, each first and second circuit access port and measurement port having a respective one of the amplifier and the voltage splitter associated therewith.

3. A probe apparatus as recited in claim 1 wherein the voltage presented to the second access port is substantially equal to the voltage received by the first access port.

4. A probe apparatus as recited in claim 1 wherein the voltage presented to the measurement port is substantially equal to the voltage received by the first access port.

5. A probe apparatus as recited in claim 4 wherein the voltage presented to the second access port is adjustable.

6. A probe apparatus as recited in claim 1 wherein the voltages presented to the second access port and the measurement port are substantially equal to the voltage received by the first access port.

7. A probe apparatus as recited in claim 1 wherein the first access port provides input to the amplifier and an amplifier output provides input to the splitter.

8. A probe apparatus as recited in claim 7 wherein the voltage splitter is a variable splitter.

9. A probe apparatus as recited in claim 1 wherein the first access port provides input to the voltage splitter and a first voltage splitter output provides input to a first amplifier and a second voltage splitter output provides input to a second amplifier.

10. A probe apparatus as recited in claim 9 wherein the first amplifier is a variable amplifier.

11. A probe apparatus as recited in claim 9 wherein the second amplifier is a variable amplifier.

12. A probe apparatus as recited in claim 1 adapted for interposition between a target system connector and a target system companion printed circuit board further comprising a printed circuit board adapted to connect to the target system connector and a probe connector disposed on the printed circuit board having a configuration similar to the target system connector.

13. A probe apparatus as recited in claim 12 wherein the target system connector and the probe connector are PCI-EXPRESS connectors.

14. A probe apparatus as recited in claim 12 and further comprising a cable connected to the measurement port and adapted to interface to test equipment.

15. A method of probing comprising:
Interposing a through circuit between first and second access ports of a test circuit,
Amplifying a voltage present at the first access port,
Splitting the amplified voltage,
Presenting a voltage at a measurement port that is substantially representative of the voltage at the first access port.

16. A method as recited in claim 15 and further comprising presenting a voltage at the second access port that is substantially representative of the voltage at the first access port.

17. A method as recited in claim 16 wherein the voltage at the second access port is substantially equal to the voltage at the measurement port.

18. A method as recited in claim 15 and further comprising presenting a voltage at the second access port that is an attenuated representation of the voltage at the first access port.

19. A method as recited in claim 15 and further comprising presenting a voltage at the second access port that is an amplified representation of the voltage at the first access port.

20. A method as recited in claim 15 wherein each step is performed for a plurality of parallel lines.

21. A method of probing comprising
Interposing a through circuit between first and second access ports of a test circuit,
Splitting a voltage presented at the first access port,
Amplifying a first split voltage,
Presenting the amplified first split voltage at the second access port,
Amplifying a second split voltage, and
Presenting the amplified second split voltage to the measurement port.

22. A method as recited in claim 21 wherein the voltage at the second access port is substantially equal to the voltage at the first access port.

23. A method as recited in claim 22 wherein the voltage at the second access port is substantially equal to the voltage at the measurement port.

24. A method as recited in claim 22 wherein the voltage at the second access port is an attenuated representation of the voltage at the first access port.

25. A method as recited in claim 22 wherein the voltage at the second access port is an amplified representation of the voltage at the first access port.

26. A method as recited in claim 21 wherein each step is performed for a plurality of parallel lines.

* * * * *